United States Patent
Fu et al.

(10) Patent No.: US 7,339,436 B2
(45) Date of Patent: Mar. 4, 2008

(54) ULTRA BROAD-BAND LOW NOISE AMPLIFIER UTILIZING DUAL FEEDBACK TECHNIQUE

(75) Inventors: Chang-Tsung Fu, Donggang Town (TW); Chien-Nan Kuo, Pingtung (TW)

(73) Assignee: National Chiao Tung University, Hsinchu (TW)

( * ) Notice: Subject to any disclaimer, the term of this patent is extended or adjusted under 35 U.S.C. 154(b) by 87 days.

(21) Appl. No.: 11/439,789

(22) Filed: May 24, 2006

(65) Prior Publication Data
US 2007/0176686 A1    Aug. 2, 2007

(30) Foreign Application Priority Data
Jan. 27, 2006    (TW) .............................. 95103292 A

(51) Int. Cl.
*H03F 1/34* (2006.01)
(52) U.S. Cl. ......................................... 330/294; 330/75
(58) Field of Classification Search .................. 330/75, 330/109, 294; 333/175
See application file for complete search history.

(56) References Cited

U.S. PATENT DOCUMENTS

| | | | |
|---|---|---|---|
| 6,026,286 A |  | 2/2000 | Long |
| 6,313,706 B1 | * | 11/2001 | Kakuta et al. ............... 330/302 |
| 6,369,655 B2 | * | 4/2002 | Nishida et al. .............. 330/294 |
| 6,441,689 B1 | * | 8/2002 | Joseph ........................ 330/302 |
| 6,566,963 B1 |  | 5/2003 | Yan et al. |
| 6,642,794 B2 |  | 11/2003 | Mulder et al. |
| 6,809,594 B2 |  | 10/2004 | Sutardja |
| 7,199,652 B2 | * | 4/2007 | Morimoto et al. .......... 327/560 |
| 2004/0130398 A1 |  | 7/2004 | Franca-Neto |

OTHER PUBLICATIONS

M. P. Heijden, L. C. N Vreede, 3. N. Burgharz, "On the design of unilateral dualloop feedback low-noise amplifiers with simultaneous noise impedance and 1W3 match" (IEEE J. Solide-State Circuits, vol. 39, No. 10 Oct. 2004, pp. 1727-1736).
D.K Shaeffer and I. H. Lee, "A 1 .5V, 1.5GHz CMOS low noise amplifier" (IEEE J. Solid-State Circuits, vol. 32, No. 5, May 1997, p. 745 to 759) (enclosed).

(Continued)

*Primary Examiner*—Henry Choe
(74) *Attorney, Agent, or Firm*—Bucknam and Archer

(57) ABSTRACT

This invention relates to a low noise amplifier, used in radio frequency integrated circuit design, especially low noise amplifiers for ultra broad-band wireless communication, comprising at least a transistor of the core circuit of a low noise amplifier structure, a transformer that is implemented on the chip, in order to form a dual feedback amplifier, that is, an amplifier structure comprising an inductive feedback and a capacitive feedback, wherein the capacitive feedback is used for the low and medium frequency range, while the inductive feedback is used for the high frequency range. By assembling an amplifier circuit with these two feedback paths, it is possible to provide a broadband and good impedance matching at the signal input end of the circuit. The low noise amplifier circuit structure of the present invention is able to provide optimal conditions for broadband input impedance matching and broadband noise optimum; besides significantly increasing the gain and gain flatness, there are also huge improvements to the noise performance and the cost-down on fabrication, and the energy consumption can also be maintained at a very low level.

25 Claims, 7 Drawing Sheets

OTHER PUBLICATIONS

A. Bevilacqua and A. M. Niknej ad, "An Ultrawideband CMOS Low-Noise Amplifier for 3.1-10.6 GHz Wireless Receivers" (IEEE J. Solid-State Circuits, vol. 39, No. 12, p. 2259 to 2268, Dec. 2004)(enclosed).

"A 3 to 10 GHz Low Noise Amplifier with Wideband LC-Ladder Matching Network" (IEEE J. Solid-State Circuits, vol. 39, No. 12, pp. 2269 to 2277, Dec. 2004) by A. Ismail and A. A. Abidi (enclosed).

Robert Hu and M. S. C. Yang, "Investigation of Different Input-Matching Mechanisms used in Wide-Band LNA Design" (International Journal of Infrared and Millimeter Waves, vol. 26, No. 2, pp. 221 to 245, Feb. 2005)(enclosed).

D. J. Cassan and J. R. Long, "A 1-V transformer-feedback low noise amplifier for 5 GHz wireless LAN in 0.18~tm CMOS" (IEEE J. Solid-State Circuits, vol. 38, No. 3, Mar. 2003 pp. 427 to 435)(enclosed).

* cited by examiner

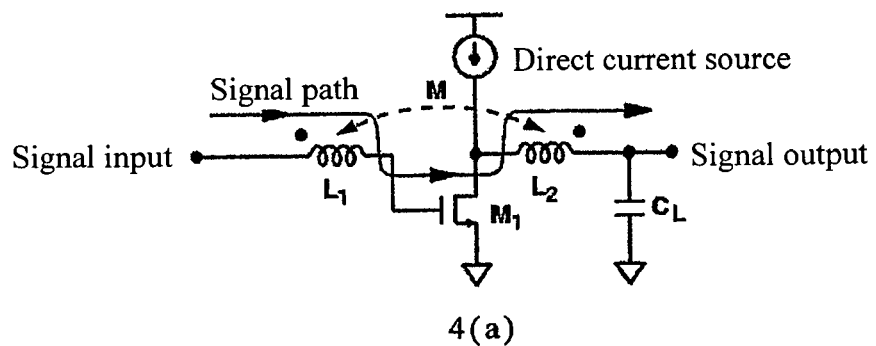
4(a)
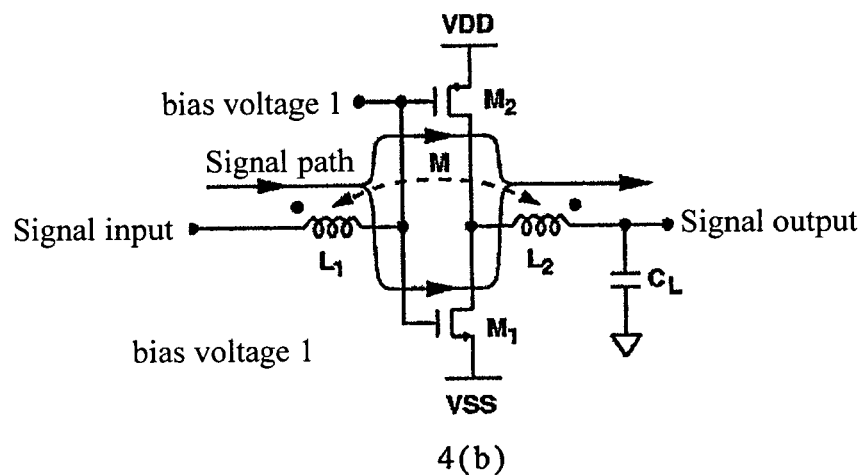
4(b)
FIG. 4
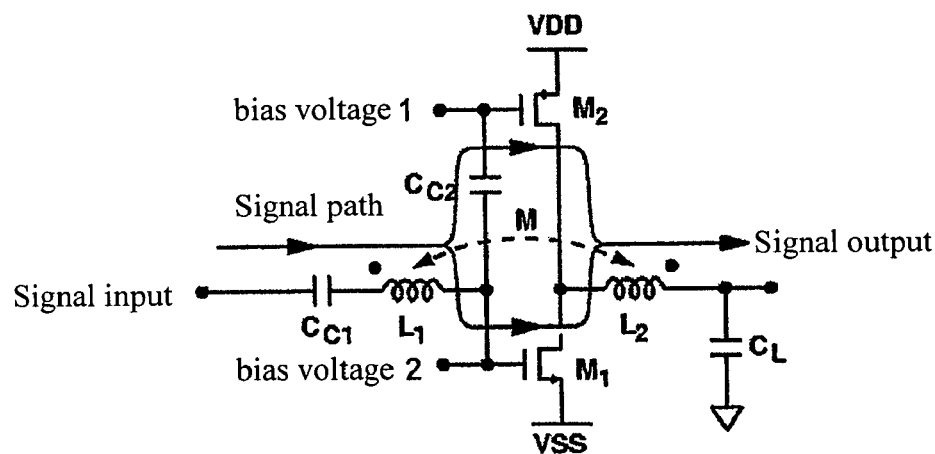
FIG. 5

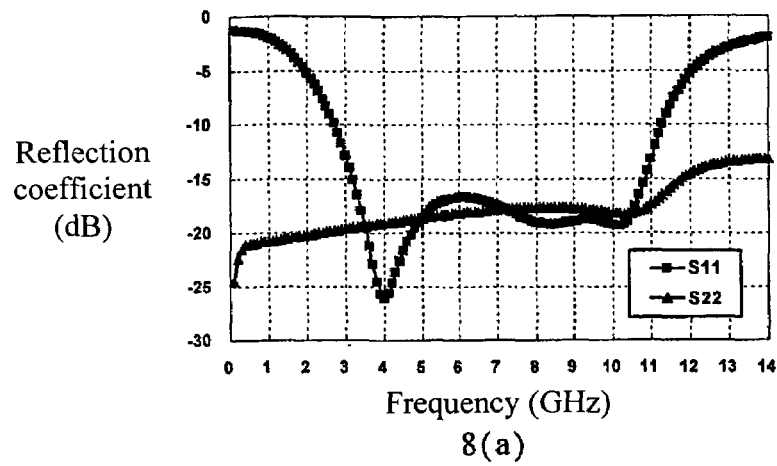
8(a)
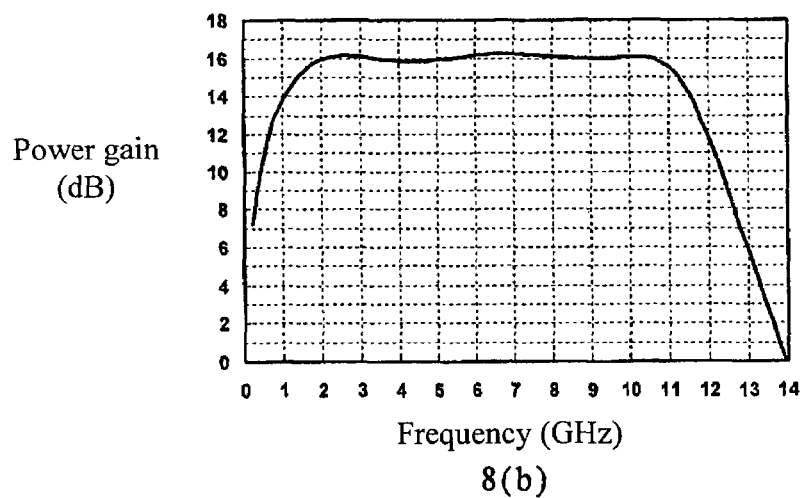
8(b)
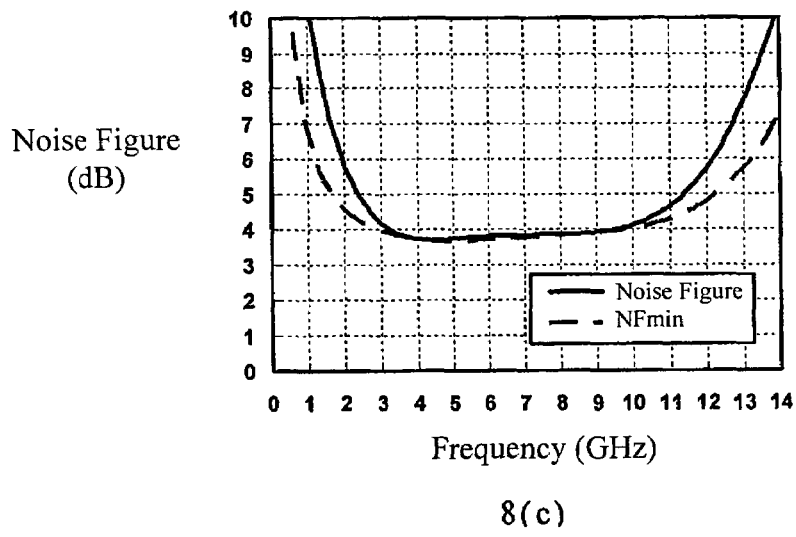
8(c)
FIG. 8(a) ~ 8(c)

ULTRA BROAD-BAND LOW NOISE AMPLIFIER UTILIZING DUAL FEEDBACK TECHNIQUE

TECHNICAL FIELD

This invention relates to a low noise amplifier which is used in the field of radio frequency integrated circuit, especially for ultra-broad-band wireless communication system.

BACKGROUND OF THE INVENTION

Due to the improvement in various technologies, the volume of information transfer required by human life, including fine pictures, multimedia broadcasts and human-computer mutual action is increasingly huge, therefore a technology to provide more high speed data transfer has thus been developed. With regards to communication systems, there is a direct correlation between the speed of data transfer and the size of the bandwidth of the system. Under same time limitation, a system with a bigger bandwidth would be able to transfer a bigger data volume. Furthermore, with an increasing focus on mobility and simplicity of design, the use of wireless systems to replace wire-based systems in communication and data transfer has already become widespread.

In a well-known communication system, a circuit to manage radio frequency signals generally comprises a transmitter and a receiver. As shown in FIG. 1, the radio frequency signals received via an antenna (01) enters into a receiver (02), then the signals is amplified by a low noise amplifier (03) and frequency of the amplified signals is transformed to baseband by a step-down converter (04); after that, the baseband signals are converted from an analog form to a digital form via an analog-to-digital converter (05), followed by carrying out digital signal processing (06), and finally the signals are sent to the application end (10). The reverse path of the signal is: the digital baseband signals from the application end (10) are passed through digital signal processing (06), and then the signals are converted from a digital form to an analog form via a digital-to-analog converter (05'), and then passed through an upconverter (07) and a power amplifier (08) and converted to radio frequency signals with a proper frequency. The downconverter (04) and upconverter (07) carries out a downconversion in frequency or a upconversion in frequency of the transmission or reception signals based on the broadcast signals from a local oscillator (09), and the low noise amplifier (03) at the receiver (02) is a crucial circuit that affects the performance of the entire system. With regards to a broadband wireless communication system, the low noise amplifier (03) must be within the required frequency range, and simultaneously it must meet the requirement of having a good broadband input impedance matching characteristic, low noise performance and a sufficiently high gain and in-band gain flatness. However, with respect to current technology, it is contradictory to design a system simultaneously capable of providing with broadband input impedance matching and broadband low noise performance.

The circuit of a conventional low noise amplifier is primarily based on the theory of resonance generated from a single group of inductance capacitance, and suitable for narrowband application of which the fractional bandwidth is less than one percent can be used. In the paper of D. K Schaeffer and T. H. Lee, "A 1.5V, 1.5 GHz CMOS low noise amplifier" (IEEE J. Solid-State Circuits, Vol. 32, No. 5, May 1997, p. 745 to 759), it is disclosed that among the various narrowband low noise amplifiers, as shown in FIG. 9, an inductive source degenerative common-source amplifier has the best performance level in terms of low noise and low power consumption, and can provide good impedance matching and signal amplification within a narrowband range.

In order to extend conventional narrowband circuits to the broadband domain, in the paper of A. Bevilacqua and A. M. Niknejad, "An Ultra wideband CMOS Low-Noise Amplifier for 3.1-10.6 GHz Wireless Receivers" (IEEE J. Solid-State Circuits, Vol. 39, No. 12, p. 2259 to 2268, Dec. 2004), and the article "A 3 to 10 GHz Low Noise Amplifier with Wideband LC-Ladder Matching Network" (IEEE J. Solid-State Circuits, Vol. 39, No. 12, pp. 2269 to 2277, December 2004) by A. Ismail and A. A. Abidi, both disclose the possibility of adding a multi-order band-pass filtering circuit to an inductive source degenerative common-source amplifying transistor, as shown in FIG. 10. Although the technology is able to provide broadband input impedance matching, the low noise performance is still kept in the narrowband range. Furthermore, too many inductors and capacitors will cause the area of the circuit board to be exceptionally large.

In the article of Robert Hu and M. S. C. Yang, "Investigation of Different Input-Matching Mechanisms used in Wide-Band LNA Design" (International Journal of Infrared and Millimeter Waves, vol. 26, no. 2, pp. 221 to 245, February 2005), it proposes the use of an inductive source degenerative source amplifier and a capacitive feedback amplifier simultaneously, as shown in FIG. 11. Although in theory the circuit is able to provide a better broadband impedance matching, but the broadband performance is significantly reduced as a result of the parasitic resistance in a transistor.

With respect to the application of transformer feedback, in the article of D. J. Cassan and J. R. Long, "A 1-V transformer-feedback low noise amplifier for 5 GHz wireless LAN in 0.18 um CMOS" (IEEE J. Solid-State Circuits, Vol. 38, No, 3, March 2003 pp. 427 to 435) and U.S. Pat. No. 6,026,296 A, have mentioned about the research and results with regards to the use of a transformer on a low noise amplifier are documented. As shown in FIG. 12, the circuit design is based on the principle of uni-lateralization, and consequently the design is only applicable in narrowband improvements, and cannot be applied for broadband frequencies.

Summing up, the objective of those researches concerning radio frequency circuits industry is to develop a circuit structure for a broadband low noise amplifier, which could break the limits of narrowband and achieve an optimal broadband flat gain, broadband impedance matching and broadband low noise performance.

SUMMARY OF INVENTION

The main objective of the present invention is to provide a novel ultra broadband low noise amplifier circuit and structure, which are significant different from conventional technology in use of a capacitive feedback and a series inductive feedback; wherein the range of working frequency of the aforesaid feedbacks is controlled by a fixed inductance, thereby achieving a broadband frequency. The core circuit structure of an ultra-broadband low noise amplifier in the present invention comprises:

an inductive series-series feedback circuit, comprising an inductive component and a transistor, wherein the inductive component must be coordinated with the transistor amplification so as to provide a series-series inductive feedback route;

a parallel-parallel capacitive feedback circuit, comprising a capacitive load, wherein the two end points are respectively connected to the output point and the ground point of the core circuit, and a parasitic capacitance of the transistor and the capacitive load is coordinated with the transistor amplification characteristic to form a parallel-parallel capacitive feedback route; and an inductive coil, wherein the two end points are respectively connected to the drain of the transistor and the output end of the core circuit.

The design for the ultra broadband low noise amplifier in the present invention includes an inductive coil that is able to provide a frequency characteristic to control the operational frequency range of the aforesaid two distinct types of feedback circuit, in order to achieve a broadband status.

Furthermore, based on the aforesaid design, as shown in FIG. 2, the system uses a frequency characteristic with a inductive coil, wherein the capacitive parallel-parallel feedback is operated at a medium-low frequency range, and the inductive series-series feedback is operated at a high frequency range, thereby enabling the system to come within the entire frequency range, and provide ultra broad-band input impedance matching.

Based on the aforesaid amplifier core circuit structure of the present invention, the transistor can be a field effect transistor (FET), a bipolar junction transistor (BJT), or etc.

FIG. 3 shows the illustrative core circuits based on the design concept of the present invention. The radio frequency signal from the antenna and which has a specific relationship between its voltage and current enters through the signal input on the left of the circuit, and after amplification, a voltage signal is transmitted from the signal output on the right of the circuit. The inductance $L_g$ (also known as the gate coil) is connected between the signal input and the transistor gate, the inductance $L_d$ (also known as the drain coil) is connected between the transistor drain and the capacitive load $C_L$, and the inductance $L_s$ (also known as the source coil) is connected between the transistor source and the ground point.

The inductance $L_s$ detects the output current from the transistor source and generates a voltage feedback to the signal input, thereby forming a series-series inductive feedback route, and constituting an inductive element with a series-series inductive feedback in the present invention. The capacitive load $C_L$ refers to the capacitive load in the present invention design that provides parallel-parallel capacitive feedback, wherein the underlying principle is that the component parasitic capacitance and the capacitive load between the gate and drain of the transistor can be coordinated with the transistor amplification characteristic to form a parallel-parallel capacitive feedback route.

The inductance $L_d$ refers to the inductive coil that provides a frequency characteristic to control the range of operating frequency of the two aforesaid types of feedback circuits. The inductance $L_g$ is used to further matching the input impedance that is generated by the two feedbacks to the particular impedance at the input signal source, in order to promote the optimization of broadband impedance matching and broadband low-noise performance at the same time.

According to the design concept of the present invention, the use of the inductance $L_d$ can enable the capacitive parallel-parallel feedback to be used at a medium-low frequency range, and the inductive series-series feedback to be operated at a high frequency range. By assembling an amplification circuit with the two aforesaid types of feedback, a very wide bandwidth and good impedance matching and optimal low noise performance can be provided at the signal input.

According to a relatively preferred embodiment for the core circuit structure of the present invention, it is characterized in a single transformer that is connected in series-series and used to substitute the three inductance $L_g$, $L_d$ and $L_s$, as shown in FIG. 3. Another objective of the invention is to provide a novel type of ultra broadband low noise amplifier, characterized in that it is based on the aforesaid design, and its core circuit structure comprises:

transformer series-series feedback circuit, comprising a first coil and a second coil that are magnetically coupled together, and a transistor, wherein the two end-points of the first coil are respectively connected to the transistor gate and the core circuit input point, and the two end-points of the second coil are respectively connected to the transistor drain and the core circuit output point, and wherein the two coils are inductively coupled to form a transformer, and the coupling of both coils is coordinated with the amplifying characteristic of the transistor to provide a series-series feedback route; and capacitive parallel-parallel feedback circuit, comprising a capacitive load, wherein the two ends are respectively connected to the core circuit output point and the ground point, and the capacitive load and parasitic capacitance of the transistor forms a parallel-parallel feedback route.

FIG. 4 shows a low noise amplifier circuit that uses a transformer series-series feedback according to the present invention. Wherein, FIG. 4(*a*) shows the structure based on a single transistor, while FIG. 4(*b*) refers to a structure that uses complementary transistors. The radio frequency signal that comes from the antenna and which has a specific voltage and current relationship enters through the signal input on the left of the circuit diagram, and after amplification, the signal output on the right transmits the radio frequency voltage signals.

The inductance $L_1$ (also known as the first coil) is connected between the signal input and the transistor gate, the inductance $L_2$ (also known as the second coil) is connected between the transistor drain and the capacitive load $C_L$, and $L_1$ and $L_2$ are inductively coupled to form a transformer, and the direction of the coupling is indicated by the dots that are marked on the inductances, and the inductance value of the coupling is M. The transformer detects the output current from the transistor drain and generates a voltage feedback to the signal input, thereby forming a series-series feedback route, referred to as a "transformer series-series feedback". Thus, the core circuit of the present invention uses a single transformer that performs like three inductances, including $L_1$, $L_2$ and M, thereby substituting the three independent inductances $L_g$, $L_d$ and $L_S$ as shown in FIG. 3. The coupling inductance value M refers to the inductive component that provides a inductive series-series feedback, the inductance $L_2$ refers to the inductive coil that provides a frequency characteristic to control the distinct operating frequency ranges of the two aforesaid feedback circuits, while the inductance $L_1$ is used to further match the input impedance to the particular impedance at the input signal source. Furthermore, the component parasitic capacitance and capacitive load between the transistor gate and drain can be coordinated with the transistor amplification to form a capacitive parallel-parallel feedback route.

The circuit in FIG. 4(a) shows that, the inductor is equivalent to a short circuit with respect to a direct current, and thus the direct current source can be fabricated on either side of the inductance $L_2$. FIG. 5 shows the different coupling capacitors based on different bias voltage. The coupling capacitor is equivalent to a short circuit with respect to a radio frequency signal, and thus the coupling capacitor can be fabricated at any point in the signal route, such as $C_{C1}$ and $C_{C2}$ in FIG. 5.

Another objective of the invention is to provide a novel type of ultra broadband low noise amplifier, essentially comprising a first-stage amplifying circuit, characterized in that the first-stage amplifying circuit comprises:

a first transistor, comprising at least a set of gate, drain and source, and the first source is connected to a ground point;

a second transistor, comprising at least a set of gate, drain and source, and the gate of the second transistor is connected to the gate of the first transistor, the drain of the second transistor is connected to the drain of the first transistor, and the second source is connected to a direct current voltage source;

a first coil and a second coil, wherein both coils are mutually magnetically coupled, and the two end-points of the first coil are respectively connected to the gate of the first transistor and the signal input of the core circuit, and the two end-points of the second coil are respectively connected to the drain of the first transistor and the signal output of the first-stage amplifying circuit, and wherein the two coils together constitute a transformer, and the coupling of both coils forms a feedback route;

a capacitive load, wherein one end is connected to the signal output of the first-stage amplifying circuit, and the other end is connected to a ground point; and a third coil, wherein one end is connected to the signal input of the first-stage amplifying circuit, and the other end is connected to a ground point.

The aforesaid ultra broadband low noise amplifier further comprises a capacitor, wherein the two end points are respectively connected to the signal input of the first amplifying circuit, and the other end is connected to a ground point, and the capacitor is used to coordinate with the third coil to suppress excessive gain and further improve impedance matching at higher frequency range.

A second aspect of the aforesaid ultra broadband low noise amplifier relates to the addition of a second stage amplifying circuit to the aforesaid first stage amplifying circuit, wherein the second stage amplifying circuit comprises:

a resistive loading;

a fourth coil and a fifth coil;

a third transistor, comprising at least a set of gate, drain and source, and the gate of the third transistor is connected to the signal output of the first-stage amplifying circuit, and the source is connected to a ground point; and a fourth transistor, comprising at least a set of gate, drain and source, and the source is connected through the fourth coil to the drain of the third transistor, and the gate is connected to a direct current voltage source, and wherein the drain functions as the signal output of the second stage amplifying circuit, and is connected through the resistor impedance and the fifth coil to a direct current voltage source.

According to the aforesaid ultra broadband low noise amplifier, the first and second transistors can be a field effect transistor (FET) or a bipolar junction transistor (BJT).

According to the aforesaid ultra broadband low noise amplifier, the third and fourth transistors can be a field effect transistor (FET) or a bipolar junction transistor (BJT).

According to the aforesaid ultra broadband low noise amplifier, the direct current voltage source can have an equivalence of a ground point with respect to the radio frequency signal. Besides, one end of a coupling capacitor can be connected to a ground point or a direct current voltage source, and form a decoupling capacitor ($C_{BP}$) which shall substitute a ground point or a direct current voltage source. The decoupling capacitor ($C_{BP}$) has an equivalence of a ground point with respect to the radio frequency signal.

FIG. 6 shows the schematic diagram of an ultra broadband low noise amplifier according to the present invention, wherein the core circuit functions as the first stage amplifying circuit in the overall low noise amplifier circuit, wherein the capacitive load $C_L$ makes use of the parasitic capacitance that is found between the third transistor gate and the source in the second stage amplifying circuit.

The first stage amplifying circuit of an ultra broadband low noise amplifier in the present invention has gain frequency with two peaks, and the two gain peaks appear at a low frequency range and a high frequency range. The second stage amplifying circuit in the present invention generates a gain peak with a relatively wide bandwidth at the medium frequency range. After the first stage amplifying circuit and the second stage amplifying circuit are assembled, the entire amplifying circuit generates good high gain and gain flatness at the low, medium and high frequency range, thereby generating wide bandwidth characteristics.

The principle about the first stage amplifying circuit generating two peaks presents that: First, the inductance $L_3$ (also known as the third coil) at the signal input is used to suppress excessive gain at the low frequency range, thereby forming a gain peak at the low frequency range; second, the inductance $L_2$ at the transformer and the capacitors, including the capacitive load $C_L$ and the output parasitic capacitance of the transistors in first stage amplifying circuit, are mutually resonated at high frequency, thereby generating another gain peak at the high frequency range. The principle about the second stage amplifying circuit in the present invention generating a gain peak with a relatively wide bandwidth at the medium frequency range presents that: a resistive loading $R_1$, inductance $L_5$ (also known as the fifth coil), and the output parasitic capacitance of the fourth transistor are used to form a R-L-C parallel resonance, thereby generating a gain peak.

The ultra broadband low noise amplifier in the present invention further comprises an inductance $L_4$ (also known as the fourth coil), which is used to provide an auxiliary gain increase at the high frequency range.

Due to the fact that the first stage amplifying circuit in the present invention has a gain peak at a high frequency range, the low noise performance at a high frequency range can be improved, and when compared to a conventional ultra broadband low noise amplifier, the low noise performance at a high frequency range is significantly improved in a ultra broadband low noise amplifier in the present invention.

Furthermore, the core circuit of the present invention is able to simulate the effects of three independent inductances ($L_1$, $L_2$ and M) at the same time by using a single transformer. This enables only the area of one inductive element to be used on an integrated circuit layout and yet achieve the same results as having three independent inductances and with the reduction in area, fabrication cost is also reduced.

BRIEF DESCRIPTION OF DRAWINGS

The invention will be more clearly understood after referring to the following detailed description read in conjunction with the drawings, wherein:

FIG. 4(a) shows the architectural diagram of a core circuit structure formed by a single transistor.

FIG. 4(b) shows the architectural diagram of a core circuit structure that uses complementary transistors.

FIG. 5 shows the series-series transformer coupled feedback low noise amplifier core circuit based on different bias voltage.

FIG. 8(a) shows the circuit simulation results in the embodiment of the present invention; which are carried out under different frequencies so as to obtain the input and output impedance matching status in the expression of reflection coefficients.

FIG. 8(b) shows the circuit simulation results in the embodiment of the present invention; which are carried out under different frequencies so as to obtain different radio frequency power gain.

FIG. 8(c) shows the circuit simulation results in the embodiment of the present invention; which are carried out under different frequencies so as to obtain different noise performance in the expression of noise figure.

DETAILED DESCRIPTION OF PREFERRED EMBODIMENTS

The relatively preferred embodiment of the present invention is described in detail below, but it should be understood that the concepts in the present invention can be expressed in many different embodiments. The embodiment herein is only one example, and does not limit the scope of the present invention.

In FIGS. 4(a) and 4(b), it can be seen that the design concept of the ultra broadband low noise amplifier according to the present invention is that a transformer series-series feedback that is connected in series and a capacitive parallel-parallel feedback that is generated from the parasitic capacitance in the transistor and a load capacitance form a double feedback route and thereby achieve a wide bandwidth.

FIG. 5 shows which uses a structure with an auxiliary transistor to explain a feedback amplifying circuit structure that is used as a core circuit structure and the core circuit structure functions as a first stage amplifying circuit in the entire low noise amplifier circuit, wherein the low noise amplifier circuit is the first stage amplifying circuit for the receiver circuit. The main objective is to provide the required gain to the weak signals that are received from the antenna, so as to increase sensitivity. The entire low noise amplifier circuit can be seen in FIG. 6, and the operating principles behind the first stage amplifying circuit and the second stage amplifying circuit are explained in detail below.

First Stage Amplifying Circuit

Figure 1:
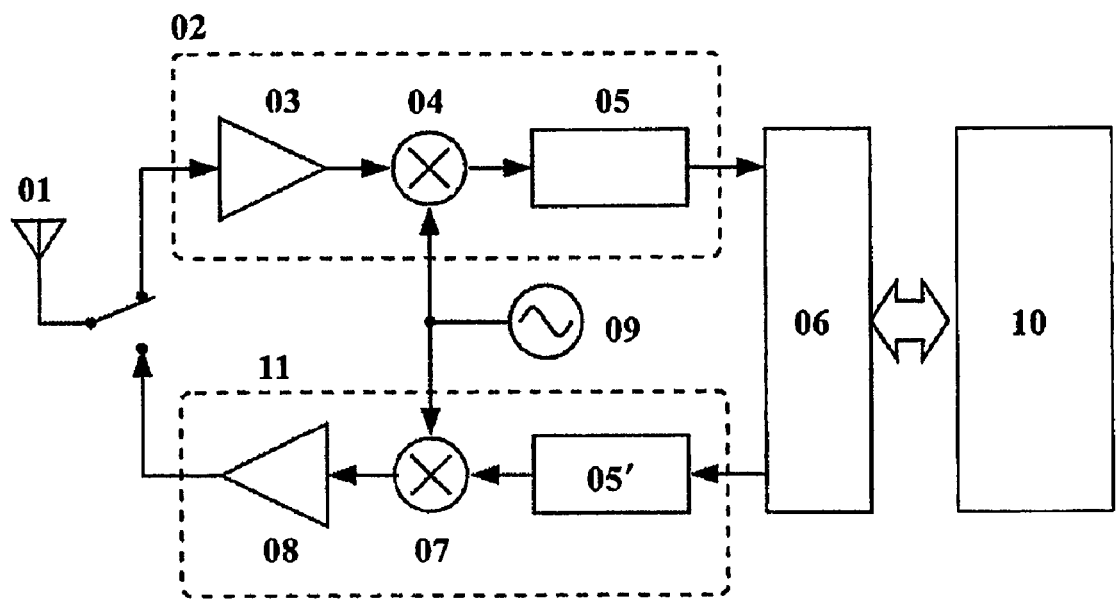
FIG. 1 shows the block diagram of a commonly-known broadband and wireless communication system.
Figure 2:
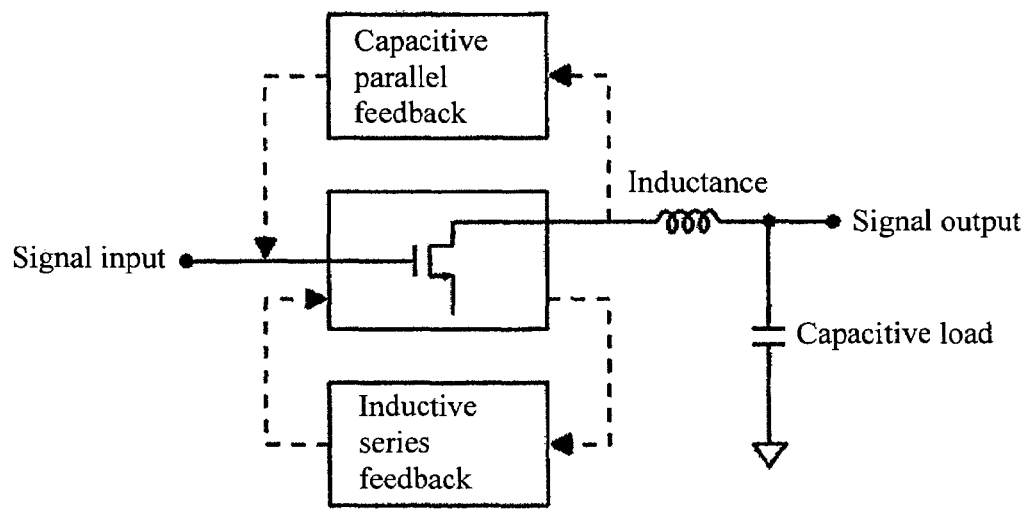
FIG. 2 shows the block diagram of the core circuit based on design concept.
Figure 3:
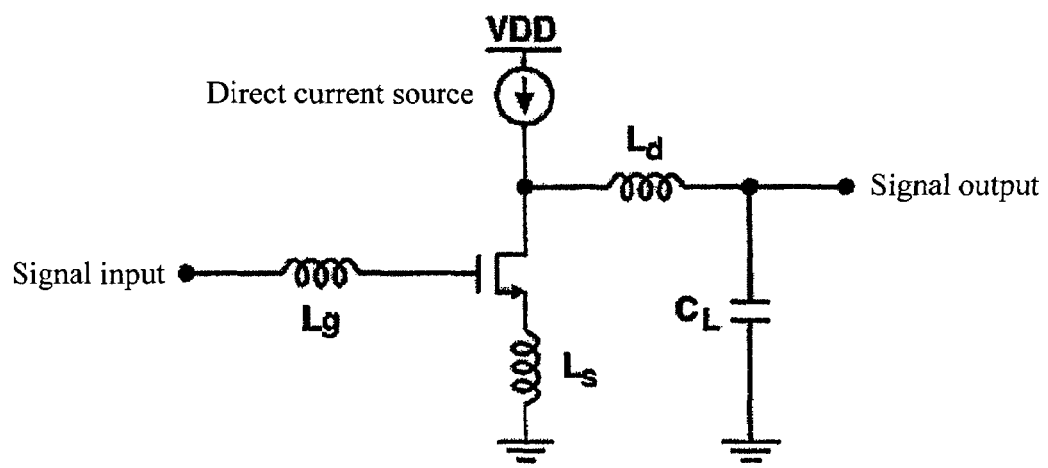
FIG. 3 shows the initial core circuit example based on the design concept.
Figure 6:
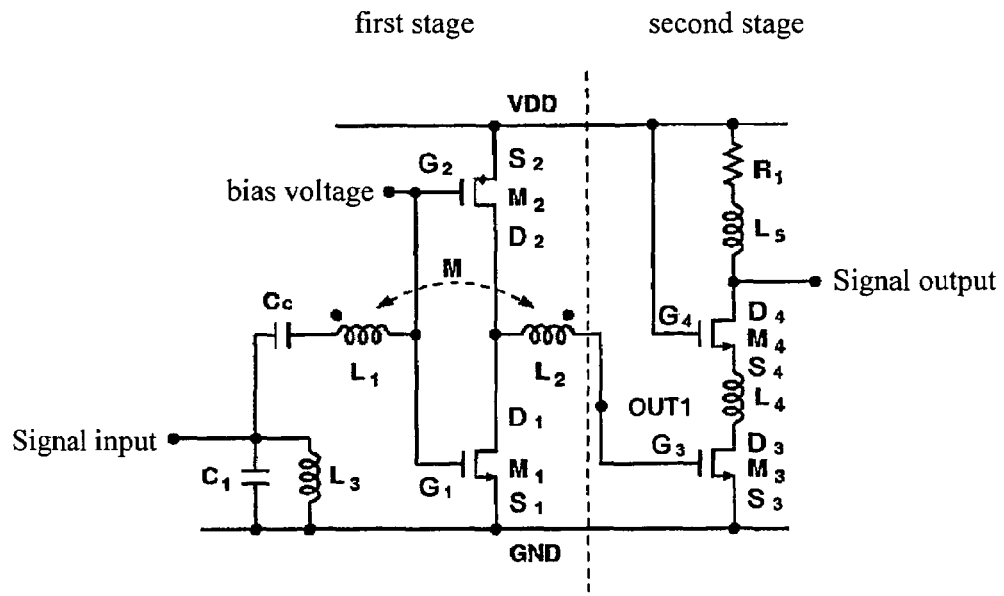
FIG. 6 shows the schematic diagram of the proposed ultra broadband low noise amplifier.

FIG. 6 shows the schematic diagram for the entire low noise amplifier circuit that is formed by a first stage amplifying circuit and a second stage amplifying circuit, wherein a feedback amplifying circuit functions as a first stage amplifying circuit in the core circuit, wherein the first stage amplifying circuit in the low noise amplifier circuit comprises at least: a first transistor $M_1$, a second transistor $M_2$, a pair of magnetically coupled first inductance $L_1$ and second inductance $L_2$, and a third inductance $L_3$.

The first transistor $M_1$ comprises at least a first gate $G_1$, a first drain $D_1$ and a first source $S_1$, and the first source $S_1$ of the first transistor $M_1$ is connected to a ground point GND. The two ends of the first inductance $L_1$ are respectively connected to the first gate $G_1$ and the signal input $IN_1$ of the low noise amplifier circuit, and the two end-points of the second inductance $L_2$ are respectively connected to the first drain $D_1$ and the signal output $OUT_1$ of the low noise amplifier circuit, and wherein the two inductances $L_1$ and $L_2$ are magnetically coupled together to constitute a transformer, and the magnetic coupling forms a feedback route. The second transistor $M_2$ comprises at least a second gate $G_2$, a second drain $D_2$ and a second source $S_2$, and the second gate $G_2$ is connected to the first gate $G_1$, and the second drain $D_2$ is connected to the first drain $D_1$, and the second source $S_2$ is connected to a direct current voltage source VDD, and one end of a third inductance $L_3$ is connected to a ground point GND, while the other end is connected to the signal input $IN_1$, and the capacitance Cc is a coupled capacitance, and due to the fact that the present circuit handles high frequency radio signals, a coupled capacitance with a high capacitance value is equivalent to a short circuit with respect to a radio frequency signal, and thus a signal input source can be added to the signal input $IN_1$ and directly entered into the feedback amplifying circuit through the capacitance Cc.

The aforesaid first stage amplifying circuit is designed so that there will be gain frequency with two gain peaks simultaneously. Due to the fact that the transistor itself has a low-pass gain frequency, the inductance $L_3$ at the signal input is first used to suppress excessive gain, and thus form a gain peak at a low frequency range, and then a transformer structure that is formed by a pair of magnetically coupled first inductance $L_1$ and second inductance $L_2$ that is connected in series-series, and the parasitic capacitance between the third gate $G_3$ and third source $S_3$ of the third transistor $M_3$ is used to substitute the load capacitance $C_L$ shown in FIG. 4, and mutual resonance takes place to create a second gain peak, and thus a gain frequency with two gain peaks is formed in the amplifying circuit.

Second Stage Amplifying Circuit

We will now discuss a second stage amplifying circuit in a low noise amplifier circuit. It can be seen from FIG. 6 that a second stage amplifying circuit comprises at least: a third transistor $M_3$, a fourth transistor $M_4$, a third inductance $L_3$, a fourth inductance $L_4$ and a resistive loading $R_1$.

The third transistor $M_3$ has a third gate $G_3$ that is connected to the signal output $OUT_1$ of the first-stage amplifying circuit, and the third source $S_3$ of the third transistor $M_3$ is connected to a ground point GND. The fourth transistor $M_4$ has a fourth gate $G_4$, and the fourth source $S_4$ of the fourth transistor $M_4$ is connected through the fourth coil $L_4$ to the third drain $D_3$ of the third transistor $M_3$, and the fourth gate $G_4$ of the fourth transistor $M_4$ is connected to a direct current voltage source VDD, and the fourth drain $D_4$ of the fourth transistor $M_4$ is connected to a direct current voltage source VDD through a joint series-series of the fifth inductance $L_5$ and the resistive loading $R_1$. $L_5$ and $R_1$ are jointly used to increase the gain at a medium frequency range, and the fourth drain $D_4$ of the fourth transistor $M_4$ functions as the signal output end of a second stage amplifying circuit.

The fourth inductance $L_4$ that is connected between the third transistor $M_3$ and the fourth transistor $M_4$ provides an auxiliary gain increase at a high frequency range. The fifth inductance $L_5$ coordinating with the resistive loading $R_1$ provides a gain at a medium frequency range, thereby enabling a complete low noise amplifier to not only have high gain within the frequency bandwidth, but also to have a gain flatness with a gain variation of less than 1-dB.

In conjunction with the first stage amplifying circuit and the second stage amplifying circuit, the low noise amplifier in the present invention is able to achieve ultra broadband gain, as well as excellent input impedance matching and low noise performance. Compared to the commonly known technology, the low noise amplifier circuit in the present invention (including the first stage amplifying circuit and the second stage amplifying circuit) not only shows an improvement in the various aspects of its performance, but also lowers the consumption of power. Furthermore, the core circuit of the present invention is able to simulate the effects of three independent inductance ($L_1$, $L_2$ and M) simultaneously by using a single transformer. This enables only the area of one inductance to be used on an integrated circuit layout and yet achieve the same results as having three independent inductances and with the reduction in area, fabrication cost is also reduced.

Above mentioned transistor can be a field effect transistor (FET) or a metal oxide semiconductor field effect transistor (MOSFET), but it can also be substituted with a bipolar junction transistor (BJT), and the base, collector and emitter of the bipolar junction transistor (BJT) corresponds to the gate, drain and source of the field effect transistor (FET), and achieves the same performance.

Simulation Results of the Embodiment

Figure 7:
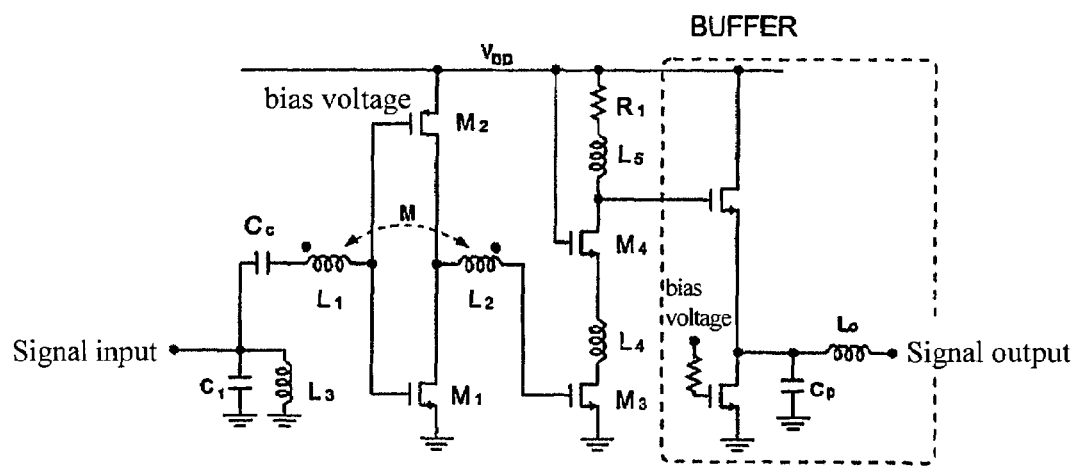
FIG. 7 shows the schematic diagram of a buffer stage circuit added to the proposed ultra broadband low noise amplifier.
Figure 9:
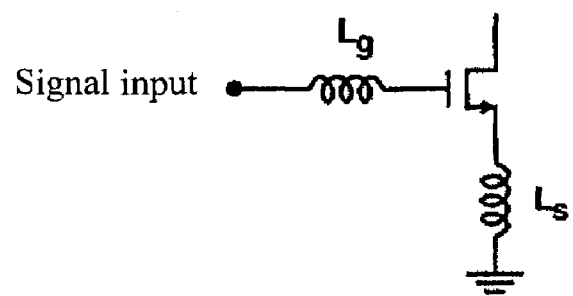
FIG. 9 shows a prior art of a narrowband low noise amplifier structure, and refers to an inductive source degenerative common-source amplifier circuit.
Figure 10:
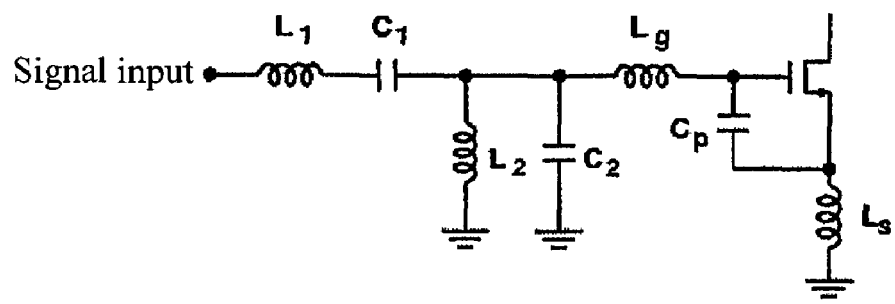
FIG. 10 shows a prior art of an inductive source degenerative amplifying transistor with an added multi-order band-pass filtering circuit structure.
Figure 11:
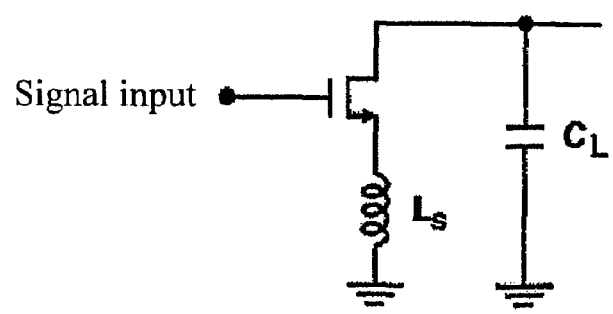
FIG. 11 shows a prior art of an amplifying circuit structure that simultaneously uses inductive source degeneration and capacitive feedback.
Figure 12:
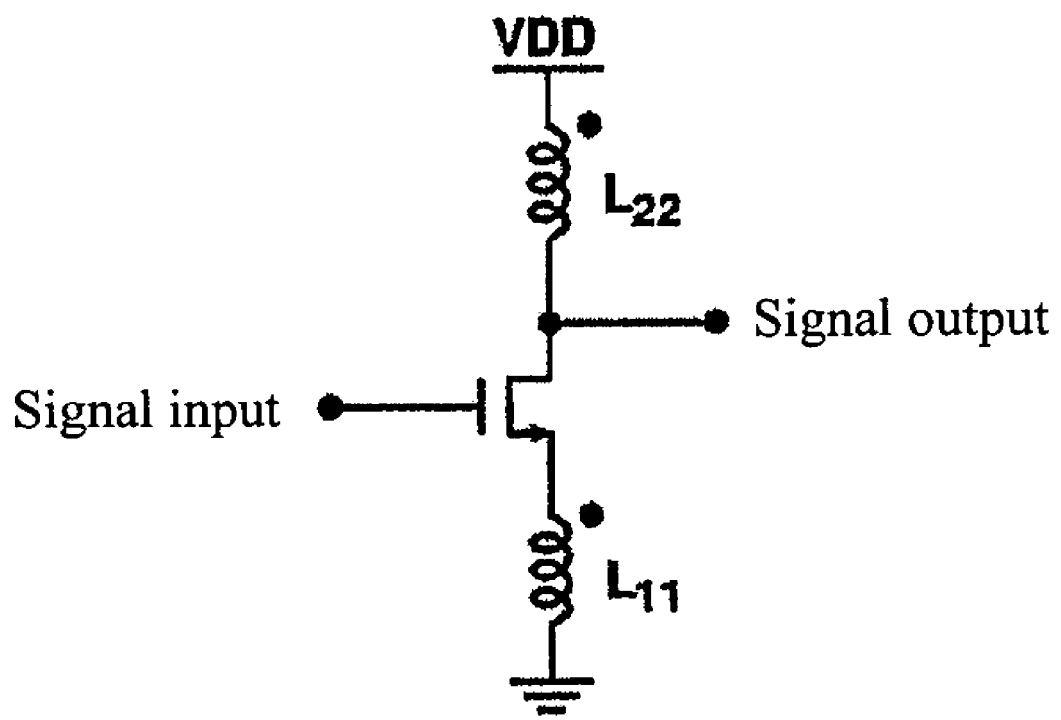
FIG. 12 shows a schematic diagram for the application of a commonly known transformer on a low noise amplifier.

The input impedance matching and output impedance matching, radio frequency power gain, and noise figure of the ultra broadband low noise amplifier circuit in the present invention under different frequencies require the addition of a buffer stage circuit BUFFER, as shown in FIG. 7, wherein it can be seen from the simulation tests that the buffer BUFFER achieves a broadband characteristic through a source follower circuit.

FIG. 8(a) to 8(c) shows the circuit simulation results for the input impedance matching and output impedance matching, radio frequency power gain, and noise figure under different frequencies.

FIG. 8(a) shows the input impedance matching and output impedance matching status, and is expressed by the reflection coefficients $S_{11}$ (input reflection coefficient) and $S_{22}$ (output reflection coefficient), and the result is less than 10-dB at a frequency range of 3.1 GHz to 10.6 GHz, and thus the results indicate an effective broadband matching.

FIG. 8(b) shows that the power gain achieves a high gain of 16-dB at a frequency range of 3.1 GHz to 10.6 GHz, and the gain variation is also less than 1-dB, and thus there is a very high gain and in-band gain flatness.

FIG. 8(c) shows that the noise figure is very low within the frequency range, and the graph almost matches the achievable minimum noise figure graph, and thus there is a very good broadband noise matching performance.

From the relatively preferred embodiment of the present invention that is stated above, the results of the technology in the present invention are as follows:

(1) An inductive series-series feedback of a transformer (first inductance, second inductance), and a capacitive parallel-parallel feedback with a parasitic capacitance between the gate and drain of the transistor, thereby achieving a broadband impedance matching and an optimal broadband low noise performance;

(2) The second inductance and the capacitors, including the capacitive load $C_L$ and the output parasitic capacitance of the transistors in first stage amplifying circuit, are mutually resonated, and together with the third inductance, is used to suppress the low frequency gain, and generate a gain frequency with two gain peaks, thereby providing broadband low noise performance.

(3) Using the techniques in (1) and (2), the ultra broadband low noise amplifier in the present invention is able to achieve a good broadband impedance matching, broadband low noise matching, and broadband gain flatness; and (4) Using a single transformer to simulate the effects of three independent inductances reduces the area of the integrated circuit layout that is required, thereby reducing fabrication costs.

Explanation of Main Components

01: antenna
02: receiver
03: low noise amplifier
04: downconverter
05: analog-to-digital converter
05': digital-to-analog converter
06: digital signal processing
07: upconverter
08: power amplifier
09: oscillator
10: application end
11: transmitter
$M_1$: first transistor
$G_1$: first gate
$D_1$: first drain
$S_1$: first source
$M_2$: second transistor
$G_2$: second gate
$D_2$: second drain
$S_2$: second source
$M_3$: third transistor
$G_3$: third gate
$D_3$: third drain
$S_3$: third source
$M_4$: fourth transistor
$G_4$: fourth gate
$D_4$: fourth drain
$S_4$: fourth source
$L_g$: gate inductance (gate coil)

$L_d$: drain inductance (drain coil)
$L_s$: source inductance (source coil)
$L_1$: first inductance (first coil)
$L_2$: second inductance (second coil)
$L_3$: third inductance (third coil)
$L_4$: fourth inductance (fourth coil)
$L_5$: fifth inductance (fifth coil)
Cc: coupling capacitor
$R_1$: resistance
BUFFER: buffer circuit
VDD: direct current voltage source
GND: ground point

We claim:

1. An ultra broadband low noise amplifier comprising a core circuit structure, wherein the core circuit structure comprises at least:
   an inductive series feedback circuit, comprising an inductive component and a transistor, wherein the inductive component must be coordinated with the transistor amplification in order to provide a series-series inductive feedback route;
   a capacitive parallel-parallel feedback circuit, comprising a capacitive load, wherein the two end points are respectively connected to the output point and the ground point of the core circuit, and a parasitic capacitance of the transistor and the capacitive load is coordinated with the transistor amplification characteristic to form a parallel-parallel capacitive feedback route; and
   an inductive coil, wherein the two end points are respectively connected to the drain of the transistor and the output end of the core circuit;
   wherein the inductive coil provides a single frequency to control the operational frequency range of said two types of feedback circuit, in order to achieve a broadband status.

2. An ultra broadband low noise amplifier comprising a core circuit structure, wherein the core circuit structure comprises at least:
   an inductive feedback circuit, comprising a first coil and a second coil that are mutually magnetically coupled, and a transistor, wherein the two end-points of the first coil are respectively connected to the transistor gate and the core circuit input point, and the two end-points of the second coil are respectively connected to the transistor drain and the core circuit output point, and wherein the two coils are inductively coupled to form a transformer, and the coupling of both coils is coordinated with the amplifying characteristic of the transistor to provide a series-series feedback route; and
   a capacitive parallel-parallel feedback circuit, comprising a capacitive load, wherein the two ends are respectively connected to the core circuit output point and the ground point, and the capacitive load and parasitic capacitance of the transistor forms a parallel-parallel feedback route.

3. The ultra broadband low noise amplifier according to claim 1, wherein the capacitive feedback circuit functions essentially as a circuit for a medium and low frequency range.

4. The ultra broadband low noise amplifier according to claim 1, wherein the inductive feedback circuit functions essentially as a circuit for a high frequency range.

5. The ultra broadband low noise amplifier according to claim 1, wherein the transistor preferably is a field effect transistor (FET) or a bipolar junction transistor (BJT).

6. The ultra broadband low noise amplifier according to claim 1, wherein the transistor is a single transistor.

7. The ultra broadband low noise amplifier according to claim 6, wherein the transistor is a set of complementary transistors.

8. The ultra broadband low noise amplifier according to claim 6, wherein the inductance is equivalent to a short circuit with respect to a direct current, and thus the current source can be installed on either side of the second inductance L2.

9. An ultra broadband low noise amplifier primarily comprising a first stage amplifying circuit, wherein the first stage amplifying circuit comprises at least:
   a first transistor, comprising at least a gate, a drain and a source, and the first source is connected to a ground point or a direct current voltage source;
   a second transistor, comprising at least a gate, a drain and a source, and the gate of the second transistor is connected to the gate of the first transistor, the drain of the second transistor is connected to the drain of the first transistor, and the second source is connected to a direct current voltage source or a ground point;
   a first coil and a second coil, wherein both coils are mutually magnetically coupled, and the two end-points of the first coil are respectively connected to the gate of the first transistor and the signal input of the low noise amplifier circuit, and the two-end points of the second coil are respectively connected to the drain of the first transistor and the signal output of the first-stage amplifying circuit, and wherein the two coils together constitute a transformer, and the coupling of both coils forms a feedback route;
   a capacitive load, wherein one end is connected to a ground point, and the other end is connected to the signal output of the first amplifying circuit; and
   a third coil, wherein one end is connected to the signal input of the first-stage amplifying circuit, and the other end is connected to a ground point.

10. The ultra broadband low noise amplifier according to claim 9, wherein the coupled capacitance is equivalent to a short circuit with respect to the radio frequency signals, and thus the coupled capacitance can be installed at any point on the signal path.

11. The ultra broadband low noise amplifier according to claim 9, wherein a second stage amplifying circuit is further added to the first stage amplifying circuit, characterized in that the second stage amplifying circuit comprises at least:
   a resistive loading;
   a fourth coil and a fifth coil;
   a third transistor, comprising a least a gate, a drain and a source, and the gate of the third transistor is connected to the signal output of the first-stage amplifying circuit, and the source is connected to a ground point; and
   a fourth transistor, comprising at least a gate, a drain and a source, and the source is connected through the fourth coil to the drain of the drain of the third transistor, and the gate is connected to a direct current voltage source, and wherein the drain functions as the signal output of the second stage amplifying circuit, and is connected through the resistor impedance and the fifth coil to a direct current voltage source.

12. The ultra broadband low noise amplifier according to claim 9, wherein the first transistor and the second transistor preferably are a field effect transistor (FET) or a bipolar junction transistor (BJT).

13. The ultra broadband low noise amplifier according to claim 9, wherein the third transistor and the fourth transistor preferably are a field effect transistor (FET) or a bipolar junction transistor (BJT).

14. The ultra broadband low noise amplifier according to claim 9, wherein the direct current voltage source is equivalent to a ground point with respect to the radio frequency signal.

15. The ultra broadband low noise amplifier according to claim 9, wherein the decoupling capacitance is equivalent to a ground point with respect to the radio frequency signal, and the direct current voltage source or ground point can be replaced by the decoupling capacitance in the event that it is required due to voltage bias.

16. The ultra broadband low noise amplifier according to claim 2, wherein the capacitive feedback circuit functions essentially as a circuit for a medium and low frequency range.

17. The ultra broadband low noise amplifier according to claim 2, wherein the inductive feedback circuit functions essentially as a circuit for a high frequency range.

18. The ultra broadband low noise amplifier according to claim 2, wherein the transistor preferably is a field effect transistor (FET) or a bipolar junction transistor (BJT).

19. The ultra broadband low noise amplifier according to claim 2, wherein the transistor is a single transistor.

20. The ultra broadband low noise amplifier according to claim 19, wherein the transistor is a set of complementary transistors.

21. The ultra broadband low noise amplifier according to claim 19, wherein the inductance is equivalent to a short circuit with respect to a direct current, and thus the current source can be installed on either side of the second inductance L2.

22. The ultra broadband low noise amplifier according to claim 11, wherein the first transistor and the second transistor preferably are a field effect transistor (FET) or a bipolar junction transistor (BJT).

23. The ultra broadband low noise amplifier according to claim 11, wherein the third transistor and the fourth transistor preferably are a field effect transistor (FET) or a bipolar junction transistor (BJT).

24. The ultra broadband low noise amplifier according to claim 11, wherein the direct current voltage source is equivalent to a ground point with respect to the radio frequency signal.

25. The ultra broadband low noise amplifier according to claim 11, wherein the decoupling capacitance is equivalent to a ground point with respect to the radio frequency signal, and the direct current voltage source or ground point can be replaced by the decoupling capacitance in the event that it is required due to voltage bias.

* * * * *